(12) United States Patent
Boerstler et al.

(10) Patent No.: US 6,927,604 B2
(45) Date of Patent: Aug. 9, 2005

(54) CLOCK SIGNAL SELECTOR CIRCUIT WITH REDUCED PROBABILITY OF ERRONEOUS OUTPUT DUE TO METASTABILITY

(75) Inventors: David W. Boerstler, Round Rock, TX (US); Eskinder Hailu, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 53 days.

(21) Appl. No.: 10/645,040

(22) Filed: Aug. 21, 2003

(65) Prior Publication Data

US 2005/0040855 A1 Feb. 24, 2005

(51) Int. Cl.[7] .................. H03K 19/00; H03K 17/00; H04L 7/00
(52) U.S. Cl. .................. 326/93; 326/94; 327/99; 327/298; 327/407; 375/354; 375/355; 375/360
(58) Field of Search .................. 326/93–97, 105, 326/56–58; 327/142, 145, 198, 99, 144; 375/355, 375, 354, 360

(56) References Cited

U.S. PATENT DOCUMENTS

| | | | |
|---|---|---|---|
| 4,999,528 A | | 3/1991 | Keech |
| 5,418,407 A | | 5/1995 | Frenkil |
| 5,483,185 A | * | 1/1996 | Scriber et al. .................. 327/99 |
| 5,510,732 A | | 4/1996 | Sandhu |
| 5,652,536 A | * | 7/1997 | Nookala et al. .................. 327/298 |
| 5,654,988 A | * | 8/1997 | Heyward et al. .................. 375/355 |
| 5,754,070 A | | 5/1998 | Baumann et al. |
| 5,793,227 A | * | 8/1998 | Goldrian .................. 326/94 |
| 5,867,695 A | | 2/1999 | Amini et al. |
| 5,999,029 A | | 12/1999 | Nguyen et al. |
| 6,072,346 A | | 6/2000 | Ghahremani |
| 6,097,775 A | * | 8/2000 | Weber .................. 375/354 |
| 6,323,715 B1 | * | 11/2001 | Vatinel .................. 327/407 |
| 6,384,619 B1 | | 5/2002 | Kim et al. |
| 6,429,692 B1 | | 8/2002 | Chan et al. |
| 6,559,679 B2 | * | 5/2003 | Kim .................. 326/93 |
| 6,653,867 B1 | * | 11/2003 | Shihadeh .................. 326/96 |
| 6,738,442 B1 | * | 5/2004 | Wilcox .................. 375/360 |

OTHER PUBLICATIONS

Rabaey, Jan; *Digital Integrated Circuits*: A *Design Perspective*; pp. 533–537; Prentice Hall (1996).

* cited by examiner

*Primary Examiner*—Vibol Tan
(74) *Attorney, Agent, or Firm*—Carr LLP; Diana R. Gerhardt

(57) ABSTRACT

A clock signal selector circuit is disclosed including a synchronizer circuit, two switching circuits, and a multiplexer. The synchronizer circuit synchronizes a first control signal to a first clock signal, thereby producing a second control signal. A first switching circuit produces the first clock signal at a first node when the second control signal is asserted. The multiplexer drives a second node with a signal at the first node when the second control signal is asserted. The second switching circuit forms an electrical connection between the first and second nodes when the second control signal is deasserted. The two switching circuits significantly reduce a probability of error at the second node due to metastability when the second control signal transitions from asserted to deasserted and the first clock signal is deselected. The second switching circuit provides electrical feedback from the second node to the first node.

20 Claims, 10 Drawing Sheets

CLOCK SIGNAL SELECTOR CIRCUIT WITH REDUCED PROBABILITY OF ERRONEOUS OUTPUT DUE TO METASTABILITY

TECHNICAL FIELD

This invention relates generally to electronic circuits and, more particularly, to clock signal selector circuits for selecting one of several different clock signals.

BACKGROUND OF THE INVENTION

A typical computer system includes logic circuitry that operates in response to a clock signal. In general, both the operational speed and the electrical power dissipation of the logic circuitry is directly related to a frequency of the clock signal. One way to reduce the electrical power dissipation of the logic circuitry, at the cost of reduced operational speed, is to reduce the frequency of the clock signal. One way to vary the frequency of the clock signal is to generate multiple clock signals having different frequencies, and to select between the multiple clock signals dependent on operational speed and power dissipation requirements.

Alternately, or in addition, the logic circuitry may need to operate at any one of several different clock signal frequencies. For example, the logic circuitry may be a bus interface designed to operate in accordance with the proposed PCI-X bus interface standard that specifies the ability to operate at both 66 MHz and 133 MHz. Generating a 66 MHz clock signal and a 133 MHz clock signal and selecting between them would allow the logic circuitry to operate at both 66 MHz and 133 MHz.

Circuits for selecting between multiple clock signals are generally called clock signal multiplexers or selectors. It is noted, however, that some clock signal multiplexers or selectors may produce narrow pulses or "glitches" when switching from one clock signal to another. As defined herein, a glitch or "runt" pulse is a pulse having a width that is less than a width of the highest frequency input clock signal. In general, such glitches or runt pulses may produce logic errors within the logic circuitry. In one specific example, an edge-triggered flip-flop receiving a clock signal having a glitch or runt pulse may exhibit a phenomenon known as "metastability."

In general, edge-triggered flip-flops have required setup times and hold times. The setup time is an amount of time the input signal must be stable before a transition of the clock signal, and the hold time is an amount of time the input signal must be stable after the transition of the clock signal. When an input signal changes (i.e., leaves a defined logic region) during either the setup time or the hold time of an edge-triggered flip-flop, the operation of the flip-flop is, in general, unpredictable. More specifically, an output signal produced by the edge-triggered flip-flop may not correctly reflect the logic values of the input signals. Further, if the output signal changes, the transition may occur much more slowly than normal. This unusual behavior of edge-triggered flip-flops when setup or hold times are violated is linked to the unstable "metastable" state existing in all bistable storage elements, and is generally referred to as metastability.

The metastability problem also arises in synchronizer circuits used to synchronize asynchronous input signals to clock signals. For example, a typical personal computer (PC) includes a mouse and a keyboard for receiving user input. Input signals from the mouse and keyboard are in general asynchronous to any clock signals used to synchronize operations of the PC. Before being used in the PC, the asynchronous input signals from the mouse and keyboard are first synchronized to a clock signal of the PC.

A common synchronizer circuit for synchronizing an asynchronous input signal to a clock signal includes an edge-triggered D flip-flop (a bistable storage element) receiving the asynchronous input signal at an input terminal. In response to either a rising edge transition or a falling edge transition of the clock signal provided to a clock control terminal, the edge-triggered D flip-flop samples a logic value of the asynchronous input signal at the input terminal and produces the logic value at an output terminal. However, the metastability problem described above arises when the asynchronous input signal is generated (i.e., is undefined or leaves a defined logic region) during either the setup time or the hold time of the edge-triggered D flip-flop.

A typical approach to the metastability problem in synchronizer circuits is to add more D flip-flops in cascade until an acceptable mean time between failure (MTBF) value is achieved. Another problem arises, however, in that each edge-triggered D flip-flop added in cascade also increases an amount of time a synchronizer circuit requires to select between multiple clock signals (i.e., increases a latency of the synchronizer circuit). This increased latency is disadvantageous for high-speed systems.

It would therefore be desirable to have a clock signal selector circuit that does not produce an output clock signal having undesirable glitches or runt pulses, has a reduced probability of erroneous output due to metastability, and wherein a reduction in the probability of erroneous output due to metastability is not achieved at a cost of increased latency.

SUMMARY OF THE INVENTION

A clock signal selector circuit is disclosed including a synchronizer circuit, two switching circuits, and a multiplexer. The synchronizer circuit receives a first clock signal and a first control signal corresponding to the first clock signal. The synchronizer circuit synchronizes the first control signal to the first clock signal, thereby producing a second control signal.

A first of the two switching circuits receives the first clock signal and the second control signal, and has an output terminal coupled to a first node. The first switching circuit produces the first clock signal at the output terminal when the second control signal is asserted.

The multiplexer is coupled between the first node and a second node and receives the second control signal. The multiplexer drives the second node with a signal at the first node when the second control signal is asserted.

The second switching circuit is coupled between the first and second nodes and receives the second control signal. The second switching circuit forms an electrical connection between the first and second nodes when the second control signal is deasserted.

The first switching circuit significantly reduces a probability of error at the second node due to metastability when the second control signal transitions from asserted to deasserted and the first clock signal is deselected. In providing electrical feedback from the second node to the first node when the second control signal transitions from asserted to deasserted and the first clock signal is deselected, the second switching circuit further reduces the probability of error at the second node due to metastability.

BRIEF DESCRIPTION OF THE DRAWINGS

The invention may be understood by reference to the following description taken in conjunction with the accompanying drawings, in which like reference numerals identify similar elements, and in which.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electromagnetic signaling techniques, and the like, have been omitted inasmuch as such details are not considered necessary to obtain a complete understanding of the present invention, and are considered to be within the understanding of persons of ordinary skill in the relevant art.

It is further noted that, unless indicated otherwise, all functions described herein may be performed in either hardware or software, or some combination thereof. In a preferred embodiment, however, the functions are performed by a processor, such as a computer or an electronic data processor, in accordance with code, such as computer program code, software, and/or integrated circuits that are coded to perform such functions, unless indicated otherwise.

Figure 1A:
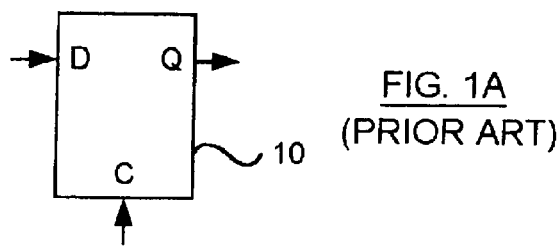
FIG. 1A is a diagram of a typical D latch having a "D" input terminal, a "C" control terminal, and a "Q" output terminal.

FIG. 1A is a diagram of a typical D latch 10 receiving a data signal at a "D" input terminal and a clock signal at a "C" control terminal, and configured to produce the data signal as an output signal at a "Q" output terminal when the clock signal is a logic '1' (i.e., when the clock signal is high), to store a value of the data signal when the clock signal transitions from high to low, and to produce the stored value as the output signal at the Q output terminal when the clock signal is low. In the D latch 10 of FIG. 1A, a "sampling event" is said to occur when the clock signal transitions from high to low.

Figure 1B:
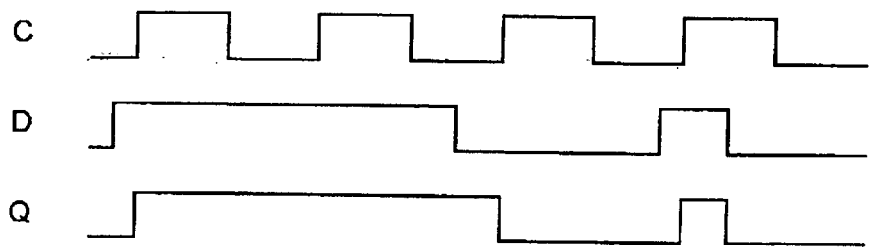
FIG. 1B is a timing diagram illustrating voltages of signals at the terminals of the D latch of FIG. 1A versus time when a data signal at the D input terminal is in a defined voltage range and stable during sampling events.

FIG. 1B is a timing diagram illustrating voltages of signals at the terminals of the D latch 10 of FIG. 1A versus time when the data signal at the D input terminal is in a defined voltage range and stable during sampling events (i.e., when the clock signal transitions from high to low).

Figure 1C:
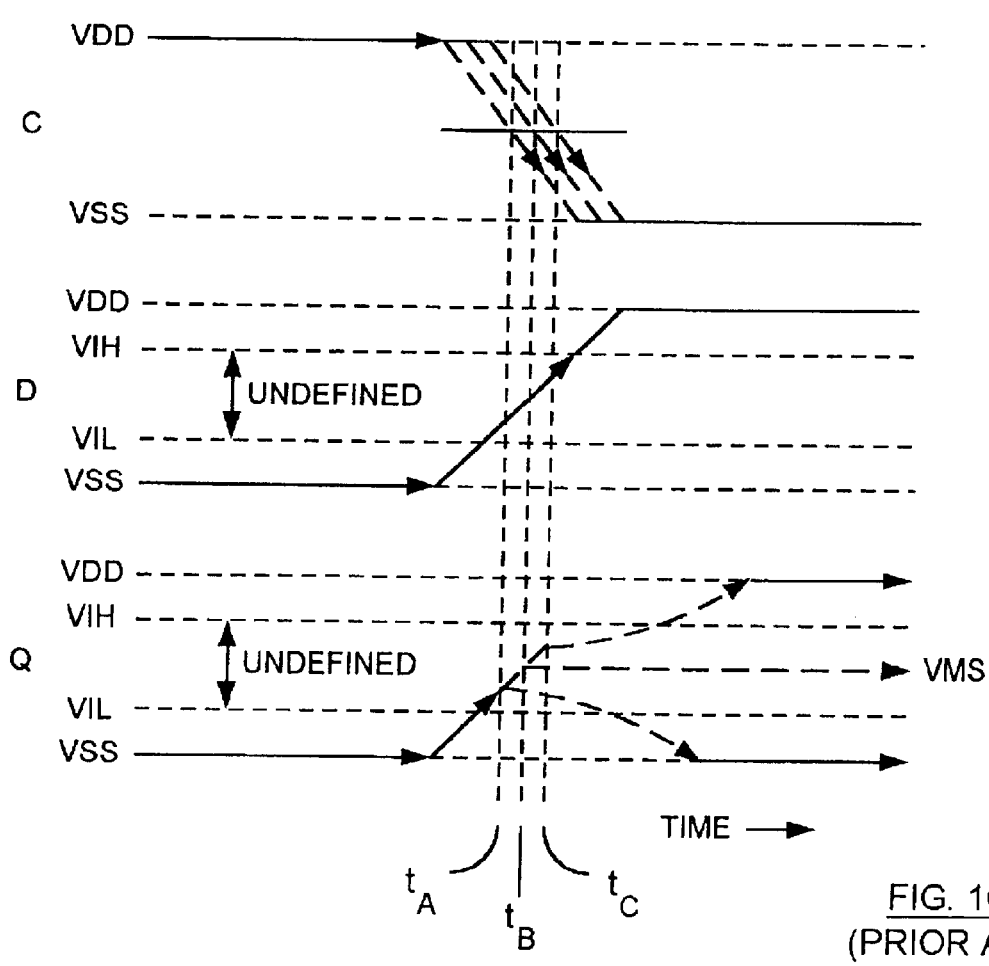
FIG. 1C is a diagram illustrating possible trajectories of an output signal produced by the D latch of FIG. 1A when the data signal at the D input terminal is in an undefined voltage range during a sampling event.

FIG. 1C is a diagram illustrating possible trajectories of the output signal produced by the D latch 10 of FIG. 1A when the data signal at the D input terminal is in an undefined voltage range during a sampling event. In the embodiment of FIGS. 1A–1C, a defined logic '1' voltage range extends from a minimum input high voltage "VIH" to a first power supply voltage "VDD", and a defined logic '0' voltage range extends from a maximum input low voltage "VIL" to a second power supply voltage "VSS," where VDD>VSS and VIH>VIL. The undefined voltage range extends between VIH and VIL as indicated in FIG. 1C. A voltage in the undefined voltage range is neither a logic '1' nor a logic '0'.

The behavior of the D latch 10 depicted in FIG. 1C is generally referred to as "metastability." When the data signal has a voltage level less than a metastable voltage level "VMS" of the D latch 10 when the sampling event occurs, the output signal voltage may decrease with time following the lower trajectory in FIG. 1C. In this situation, an undesirable narrow or "runt" pulse may be produced at the Q output terminal.

When the data signal has a voltage level greater than the metastable voltage level VMS of the D latch 10 when the sampling event occurs, the output signal voltage may increase with time following the upper trajectory in FIG. 1C. In this situation, the propagation time of the D latch 10 is typically significantly greater than expected.

When the data signal has a voltage level exactly equal to the metastable voltage level VMS of the D latch 10 when the sampling event occurs, the output signal voltage may remain at the metastable voltage level VMS for an undeterminable length of time as indicated in FIG. 1C. Eventually, noise voltage may cause the output signal voltage to become greater than or less than the metastable voltage level VMS. When the output signal voltage becomes greater than the metastable voltage level VMS, the output signal voltage expectedly increases with time, eventually entering the logic '1' voltage range. When the output signal voltage becomes less than the metastable voltage level VMS, the output signal voltage expectedly decreases with time, eventually entering the logic '0' voltage range. In either case, the final voltage level of the output signal is generally unpredictable and the propagation time of the D latch 10 is significantly greater than expected.

The transient behavior of the output signal voltage V(t) produced by the D latch 10 of FIG. 1A when the data signal at the D input terminal is in the undefined voltage range during a sampling event can be accurately modeled as a system having a single dominant pole:

$$V(t) = VMS + [V(0) - VMS]e^{t/\tau}$$

where V(0) is the output signal voltage at sampling time 0, t=time, and "τ" is the time constant of the system.

For a noiseless system, if the sampled voltage is the metastable voltage level VMS of the D latch 10, the above equation for V(t) implies it will take an infinite amount of time for the metastable condition to solve to a stable state. No real systems are totally noiseless, however, and added noise voltages tend to ensure metastable conditions solve to stable states in finite amounts of time.

Figure 2:
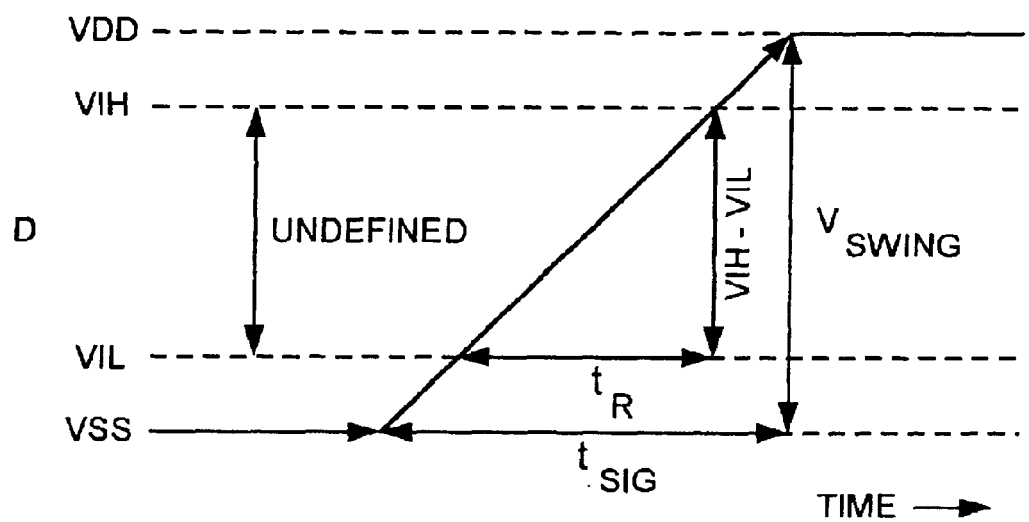
FIG. 2 is a linear approximation of a rising edge transition of the data signal at the D input terminal of the D latch of FIG. 1A versus time when the sampling event of FIG. 1C occurs.

FIG. 2 is a linear approximation of a rising edge transition of the data signal at the D input terminal of the D latch 10 of FIG. 1A versus time when the sampling event of FIG. 1C occurs. In the linear approximation of FIG. 2, the rising edge of the data signal at the D input terminal of the D latch 10 (i.e., the data signal D) is a straight line, and the voltage of the data signal D increases linearly from VSS to VDD in time $t_{SIG}$. The voltage swing of the data signal D is denoted $V_{SWING}$, where $V_{SWING}$=VDD−VSS. The voltage of the data signal D is in the undefined region between VIH and VIL for a period of time $t_R$, where $t_R = t_{SIG} \cdot [(VIH-VIL)/V_{SWING}]$.

Using the linear approximation of FIG. 2, and assuming the sampling event is equally probable at any time during the rising edge transition of the data signal D, the probability of an error occurring in the output signal of the D latch 10 of FIG. 1A due to metastability following the sampling event (i.e., the probability that the voltage of the data signal D is in the undefined region bound by VIH and VIL at sampling time t=0) is:

$$P_{ERROR}(0) = [(VIH-VIL)/V_{SWING}](t_R/t_{SIG})$$

The probability that the voltage of the output signal produced by the D latch 10 of FIG. 1A at the output terminal is in the undefined region as times progresses is given by:

$$P_{ERROR}(t) = [P_{ERROR}(0)]e^{(-t/\tau)}$$

Figure 3:
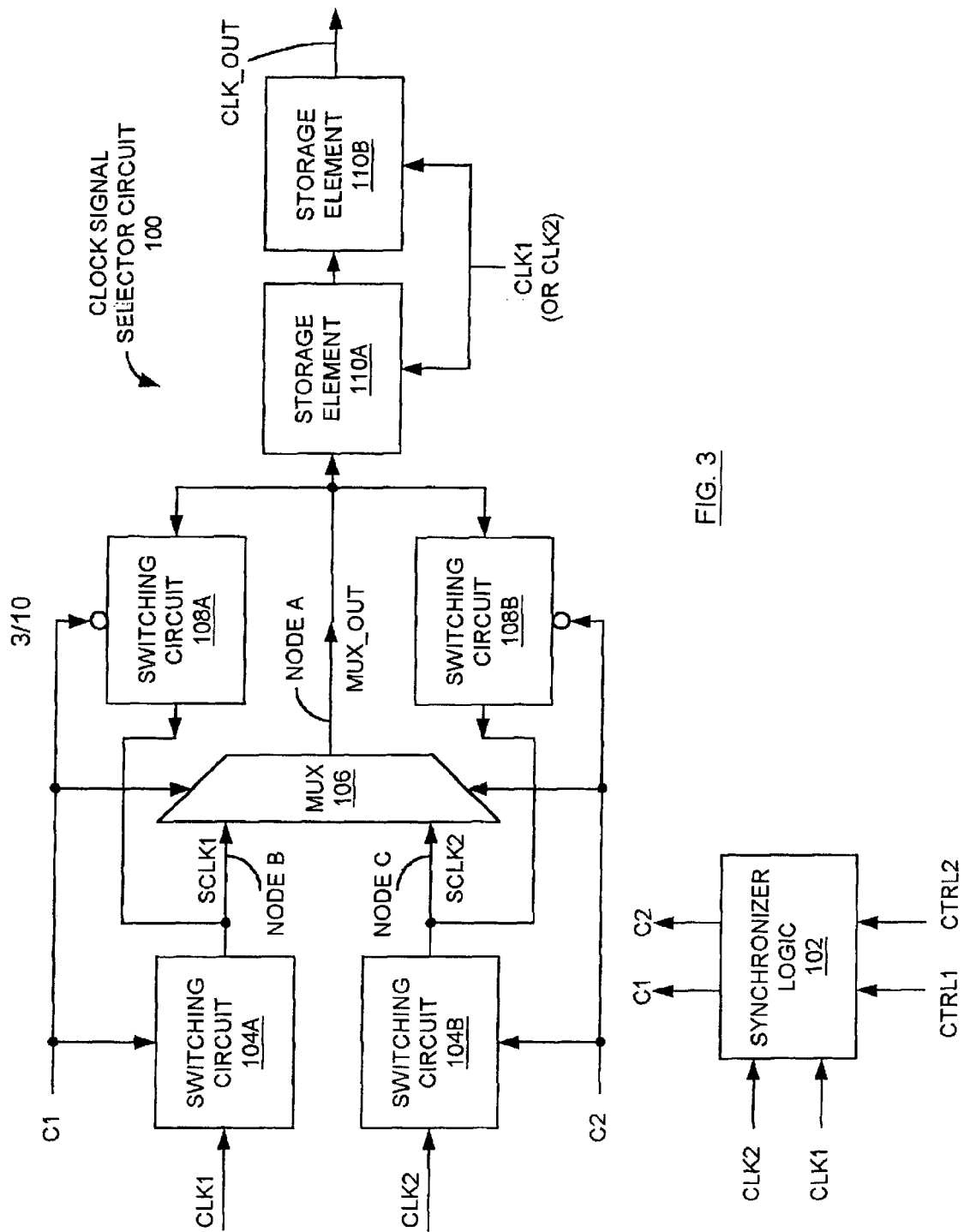
FIG. 3 is a diagram of one embodiment of a clock signal selector circuit having a relatively low probability of producing an erroneous output signal due to metastability, wherein the clock signal selector circuit includes synchronizer logic, a multiplexer, and two sets of switching circuits.

FIG. 3 is a diagram of one embodiment of a clock signal selector circuit 100 having a relatively low probability of producing an erroneous output signal due to metastability. In the embodiment of FIG. 3, the clock signal selector circuit 100 selects between two input clock signals "CLK1" and "CLK2" to produce an output signal "CLK_OUT."

The clock signal selector circuit 100 of FIG. 3 includes synchronizer logic 102. The synchronizer logic 102 receives the clock signal CLK1 and a corresponding control signal "CTRL1." The control signal CTRL1 is asserted (i.e., active) when the clock signal selector circuit 100 is to produce the input clock signal CLK1 as the output signal CLK_OUT. The synchronizer logic 102 also receives the clock signal CLK2 and a corresponding control signal "CTRL2." The control signal CTRL2 is asserted (i.e., active) when the clock signal selector circuit 100 is to produce the input clock signal CLK2 as the output signal CLK_OUT.

As described below, the synchronizer logic 102 synchronizes the control signal CTRL1 to the clock signal CLK1, thereby producing an output control signal "C1." Similarly, the synchronizer logic 102 synchronizes the control signal CTRL2 to the clock signal CLK2, thereby producing an output control signal "C2." As described below, the control signals C1 and C2 are used to select the clock signals CLK1 and CLK2, respectively, for output as the output signal CLK_OUT. The control signals CTRL1 and CTRL2 are synchronized to the clock signals CLK1 and CLK2, respectively, to ensure the output signal CLK_OUT is free of any narrow (i.e., "runt") pulses or glitches. Further, the control signals C1 and C2 are not asserted (i.e., active) at the same time; that is, C1·C2=0 at all times.

Figure 4A:
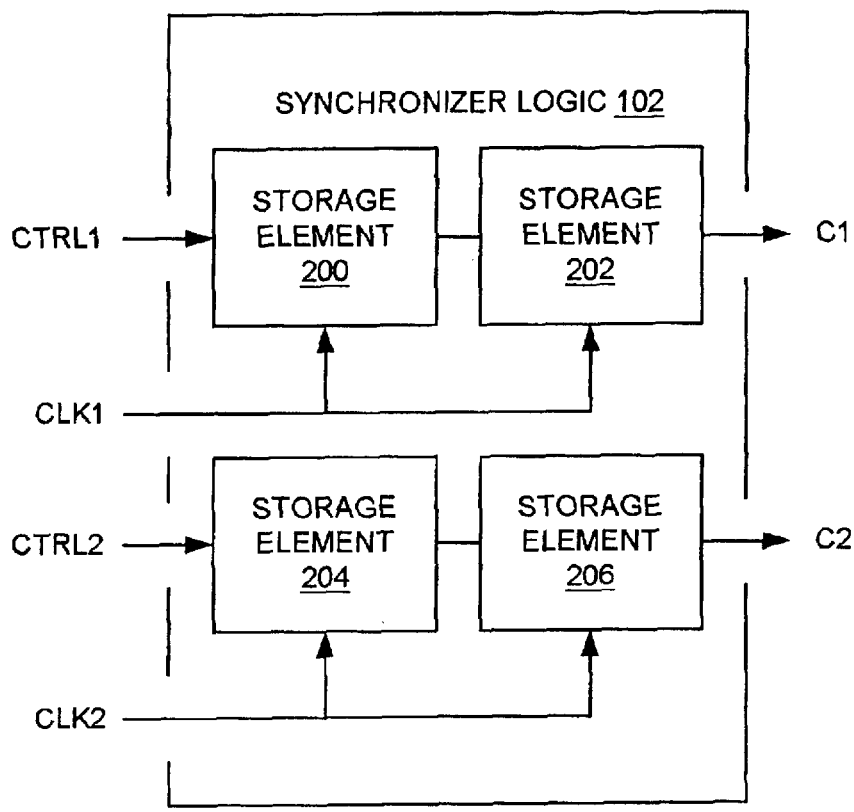
FIG. 4A is a diagram of one embodiment of the synchronizer logic of FIG. 3.

FIG. 4A is a diagram of one embodiment of the synchronizer logic 102 of FIG. 3. In the embodiment of FIG. 4A, the synchronizer logic 102 includes a storage element 200 and a storage element 202 connected in series such that an output terminal of the storage element 200 is connected to an input terminal of the storage element 202. The storage element 200 receives the control signal CTRL1 at an input terminal, and the storage element 202 produces the control signal C1 at an output terminal. Both the storage elements 200 and 202 receive the clock signal CLK1 at control terminals.

In one embodiment, the storage elements 200 and 202 are latches forming a master-slave flip-flop. The storage element 200 is configured to produce the input CTRL1 signal as an output signal at the output terminal when the clock signal CLK1 is a logic '0' (i.e., when the clock signal CLK1 is low), to store a value of the input CTRL1 signal when the clock signal CLK1 transitions from low to high, and to produce the stored value as the output signal at the output terminal when the clock signal CLK1 is high. The storage element 202 is configured to produce the input signal from the storage element 200 as the control signal C1 at the output terminal when the clock signal CLK1 is a logic '1' (i.e., when the clock signal CLK1 is high), to store a value of the input signal from the storage element 200 when the clock signal transitions from high to low, and to produce the stored value as the control signal C1 at the output terminal when the clock signal CLK1 is low.

In the embodiment of FIG. 4A, the synchronizer logic 102 also includes a storage element 204 and a storage element 206 connected in series such that an output terminal of the storage element 204 is connected to an input terminal of the storage element 206. The storage element 204 receives the control signal CTRL2 at an input terminal, and the storage element 206 produces the control signal C2 at an output terminal. Both the storage elements 204 and 206 receive the clock signal CLK2 at control terminals.

In one embodiment, the storage elements 204 and 206 are latches forming a master-slave flip-flop. The storage element 204 is configured to produce the input CTRL2 signal as an output signal at the output terminal when the clock signal CLK2 is a logic '0' (i.e., when the clock signal CLK2 is low), to store a value of the input CTRL2 signal when the clock signal CLK2 transitions from low to high, and to produce the stored value as the output signal at the output terminal when the clock signal CLK2 is high. The storage element 206 is configured to produce the input signal from the storage element 204 as the control signal C2 at the output terminal when the clock signal CLK2 is a logic '1' (i.e., when the clock signal CLK2 is high), to store a value of the input signal from the storage element 204 when the clock signal transitions from high to low, and to produce the stored value as the control signal C2 at the output terminal when the clock signal CLK2 is low.

The cascaded storage elements 200 and 202 producing the control signal C1 significantly reduce the probability of error in the control signal C1 due to metastability. Similarly, the cascaded storage elements 204 and 206 producing the control signal C2 significantly reduce the probability of error in the control signal C2 due to metastability.

It is noted that the storage elements 200 and 202, and the storage elements 204 and 206, as described above operate as level-sensitive latches. However, the storage elements 200, 202, 204, and 206 may operate in other ways to form master-slave flip-flops. Further, the storage elements 200, 202, 204, and 206 may be edge-triggered flip-flops.

Figure 4B:
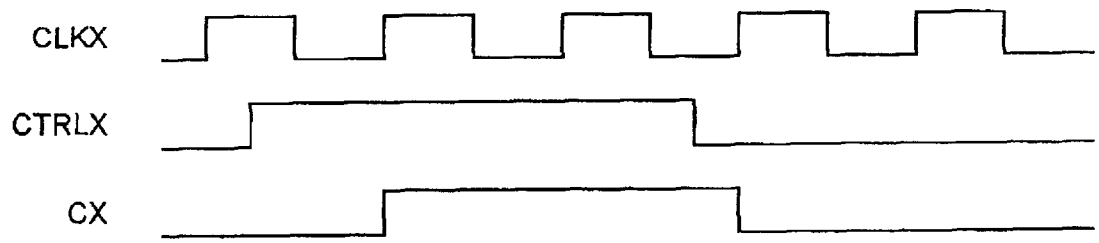
FIG. 4B is an exemplary timing diagram illustrating voltages of signals received and produced by the synchronizer logic of FIG. 3 versus time.

FIG. 4B is an exemplary timing diagram illustrating voltages of signals received and produced by the synchronizer logic 102 of FIG. 3 versus time. In the embodiment of FIG. 4B, the storage elements 200 and 202, and the storage elements 204 and 206, are latches forming master-slave flip-flops, and operate as described above. The "X" at the end of signal names in FIG. 4B is either '1' or '2'. In FIG. 4B, the control signal C1 produced by the synchronizer logic 102 of FIG. 4A is asserted and deasserted (i.e., activated and deactivated) on rising edges of the clock signals CLK1, and therefore synchronized to the CLK1 signal. Similarly, the control signal C2 produced by the synchronizer logic 102 is asserted and deasserted on rising edges of the clock signals CLK2, and therefore synchronized to the CLK2 signal.

Figure 5:
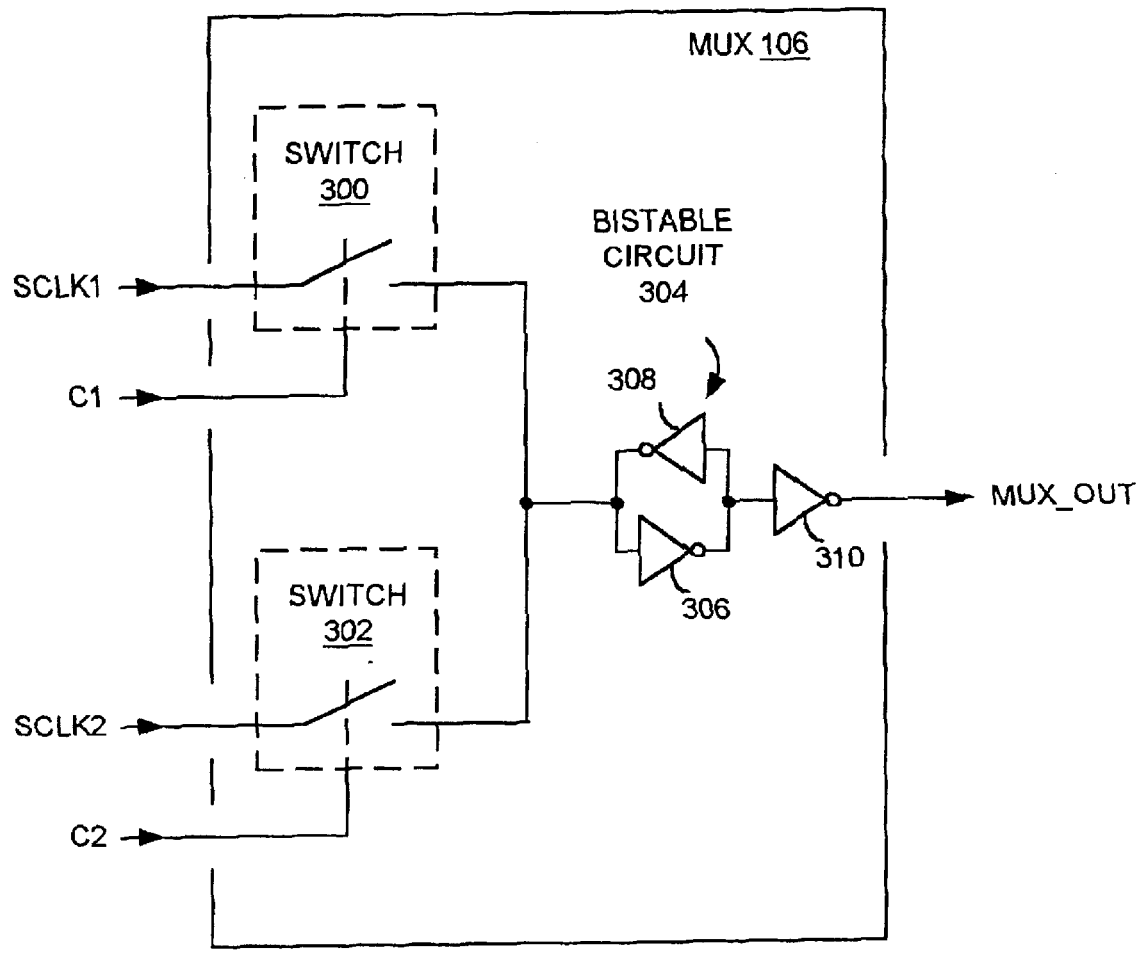
FIG. 5 is a diagram of one embodiment of the multiplexer of FIG. 3.

The clock signal selector circuit 100 of FIG. 3 also includes a multiplexer (MUX) 106 producing a MUX_OUT signal at an output terminal. FIG. 5 is a diagram of one embodiment of the MUX 106 of FIG. 3, wherein the MUX 106 includes a first switch 300, a second switch 302, a bistable circuit 304, and an inverting output buffer 306. The bistable circuit 304 of the MUX 106 is subject to metastability, as are all bistable circuits.

The switch 300 receives a selected clock 1 "SCLK1" signal at an input terminal and the control signal C1 at a control terminal. An output terminal of the switch 300 is connected to an input terminal of the bistable circuit 304. When the control signal C1 is asserted (i.e., active), the switch 300 forms an electrical connection between the input terminal and the output terminal. In this situation, an electrical connection is formed between the signal line conveying the SCLK1 signal and the input terminal of the bistable circuit 304.

The switch 302 receives a selected clock 2 "SCLK2" signal at an input terminal and the control signal C2 at a control terminal. An output terminal of the switch 302 is connected to the input terminal of the bistable circuit 304. When the control signal C2 is asserted (i.e., active), the switch 302 forms an electrical connection between the input terminal and the output terminal. In this situation, an electrical connection is formed between the signal line conveying the SCLK2 signal and the input terminal of the bistable circuit 304.

As the control signals C1 and C2 are not asserted (i.e., active) at the same time, the switches 300 and 302 are never enabled simultaneously. The switches 300 and 302 may be, for example, transmission gates.

The bistable circuit 304 includes a first inverter 306 having an input terminal connected to the input terminal of the bistable circuit 304 and an output terminal connected to an output terminal of the bistable circuit 304. The bistable circuit 304 also includes a second inverter 308 having an input terminal connected to the output terminal of the bistable circuit 304 and an output terminal connected to the input terminal of the bistable circuit 304. The inverter 308 is a "weak" inverter having a relatively low signal driving capability, and the inverter 306 has a greater signal driving capability than the inverter 308.

The inverting output buffer 310 has an input terminal connected to the output terminal of the bistable circuit 304 and an output terminal connected to an output terminal of the MUX 106. The inverting output buffer 310 produces the output signal MUX_OUT of the MUX 106. In general, when the control signal C1 is asserted (i.e., active), MUX_OUT=SCLK1. When the control signal C2 is asserted, MUX_OUT=SCLK2. As described above, the control signals C1 and C2 are not asserted at the same time.

When the control signals C1 and C2 are both deasserted (i.e., not active), the input of the bistable circuit 304 is driven by the weak inverter 308. In this situation, the MUX_OUT signal expectedly stays the value it was when both of the control signals C1 and C2 went low. Thus in addition to producing a selected one of the two input clock signal SCLK1 and SCLK2, the MUX 106 also stores a last value when neither one of the input clock signals is selected.

Figure 6:
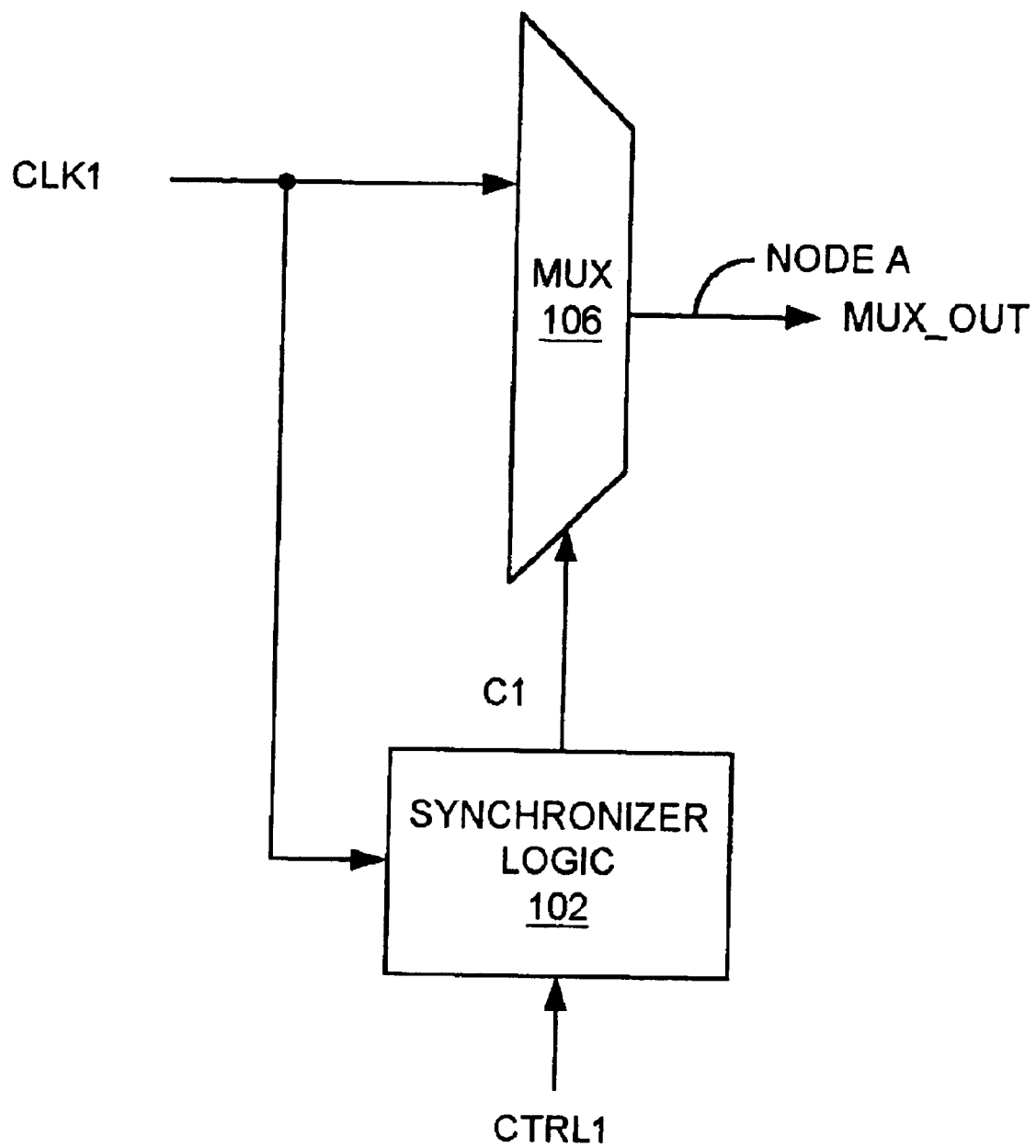
FIG. 6 is a diagram of a portion of the clock signal selector circuit of FIG. 3 including the synchronizer logic of FIGS. 3 and 4A and the multiplexer of FIGS. 3 and 5, wherein an input clock signal is applied directly to a corresponding input terminal of the multiplexer.

FIGS. 6–9 will now be used to describe sources of metastability in the clock signal selector circuit 100 of FIG. 3, how propagation delays of switching circuits 104A and 104B of the clock signal selector circuit 100 reduce the probability of error in the output signal CLK_OUT due to metastability, and how feedback provided by switching circuits 108A and 108B of the clock signal selector circuit 100 further reduces the probability of error in the output signal CLK_OUT due to metastability. FIG. 6 is a diagram of a portion of the clock signal selector circuit 100 of FIG. 3 including the synchronizer logic 102 of FIGS. 3 and 4A and the MUX 106 of FIGS. 3 and 5, wherein the CLK1 signal is applied directly to a corresponding input terminal of the MUX 106. A node A exists at the output terminal of the MUX 106 as shown in FIG. 3.

In FIG. 6, when the control signal C1 is asserted (i.e., active), MUX_OUT=CLK1. Referring back to FIG. 5, the switch 302 of the MUX 106 will be ignored during the description of metastability sources. When the control signal C1 is deasserted (i.e., not active), the input of the bistable circuit 304 is driven by the weak inverter 308. In this situation, the MUX_OUT signal expectedly stays the value it was when the control signal C1 went low.

There are two main sources of metastability that can affect the performance of the circuit of FIG. 6. The first source of metastability originates in the synchronizer logic 102. The probability of metastability occurring in the synchronizer logic 102 must be low enough to ensure that the control signals C1 and C2 are not asserted (i.e., active) at the same time. In FIG. 4A, and as described above, the cascaded storage elements 200 and 202 producing the control signal C1 significantly reduce the probability of error in the control signal C1 due to metastability.

Figure 7:
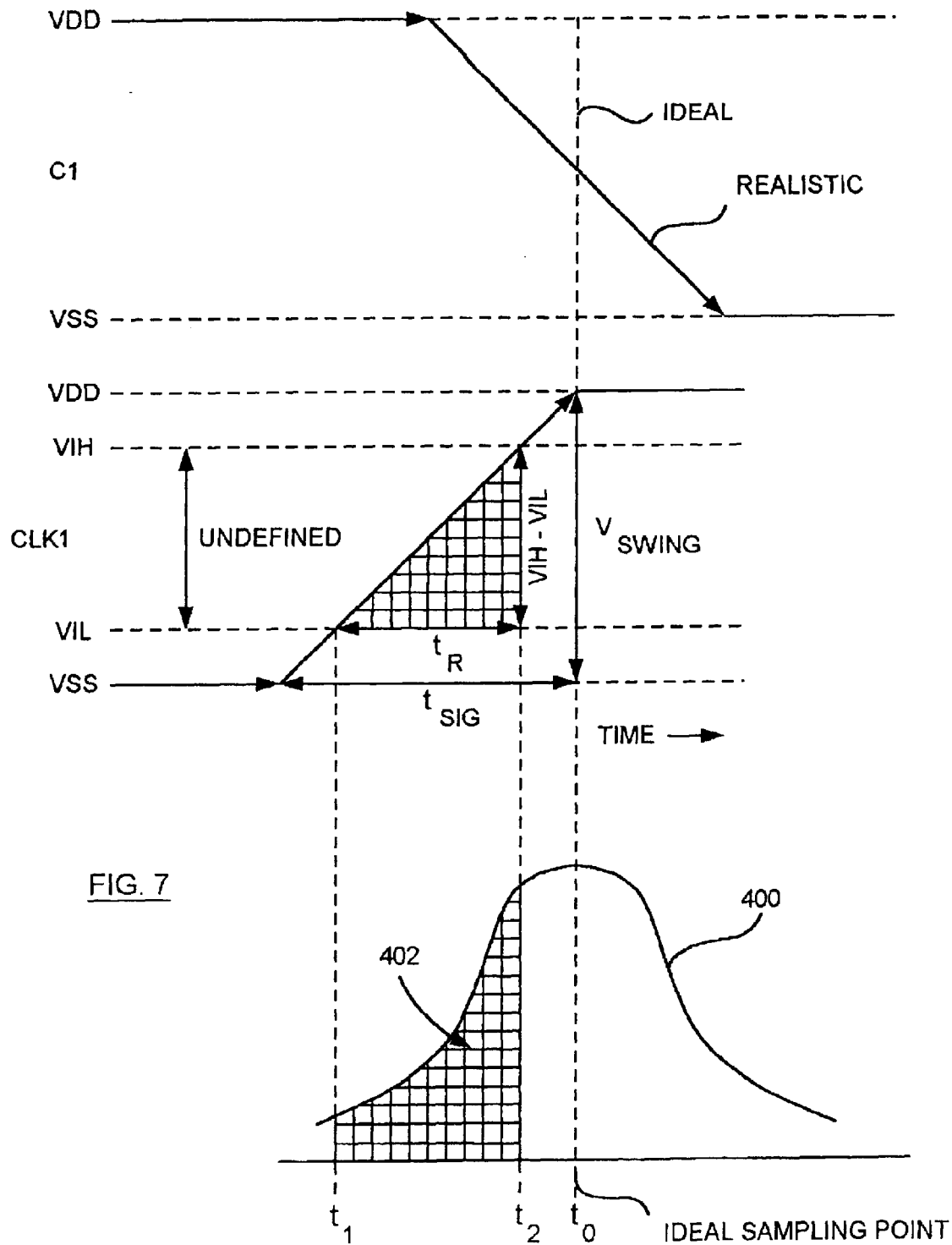
FIG. 7 is a diagram depicting an estimation of the probability of error in a signal produced by the multiplexer of FIG. 6 due to metastability.

The second source of metastability in the circuit of FIG. 6 originates in the MUX 106. FIG. 7 is a diagram depicting an estimation of the probability of error in the MUX_OUT signal produced by the MUX 106 at the node A of FIG. 6 due to metastability. As illustrated in FIG. 7, the time at which a sampling event occurs within the MUX 106 of FIG. 6 as the control signal C1 transitions from high to low is modeled as having a Gaussian probability distribution 400 centered about a mean time "$t_o$." The Gaussian distribution is, for example, a result of jitter caused by uncertainty in the arrival time of the clock signal CLK1 and/or the control signal C1. In FIG. 7, the probability of a sampling event occurring at time t is:

$$P_{SAMPLING} = Ce^{(-|t-t0|/a)}$$

where "C" and "a" are system and signal dependent parameters.

As indicated in FIG. 4B, the control signal C1 is asserted and deasserted on rising edges of the clock signal CLK1. As a result, the clock signal CLK1 is enabled (i.e., "turned on") and disabled (i.e., "turned off") at rising edges.

As indicated in FIG. 7, a linear approximation of the rising edge transition of the CLK1 signal is assumed when the sampling event occurs within the MUX 106 of FIG. 6. For any given sampling event, the probability that the sampling event occurs between times $t_1$ and $t_2$ can be computed by integrating $P_{SAMPLING}$ between these two points:

$$P(t1 < t < t2) = \left( \int_{t1}^{t2} Ce^{(-|t-t0|/a)} dt \right)$$

where $P(-\infty < t < +\infty) = 1$.

In FIG. 7, the probability of error in the output signal MUX_OUT produced by the MUX 106 of FIG. 6 due to metastability is indicated by the hatched region 402 of the Gaussian probability distribution 400 between times $t_1$ and $t_2$.

Figure 8:
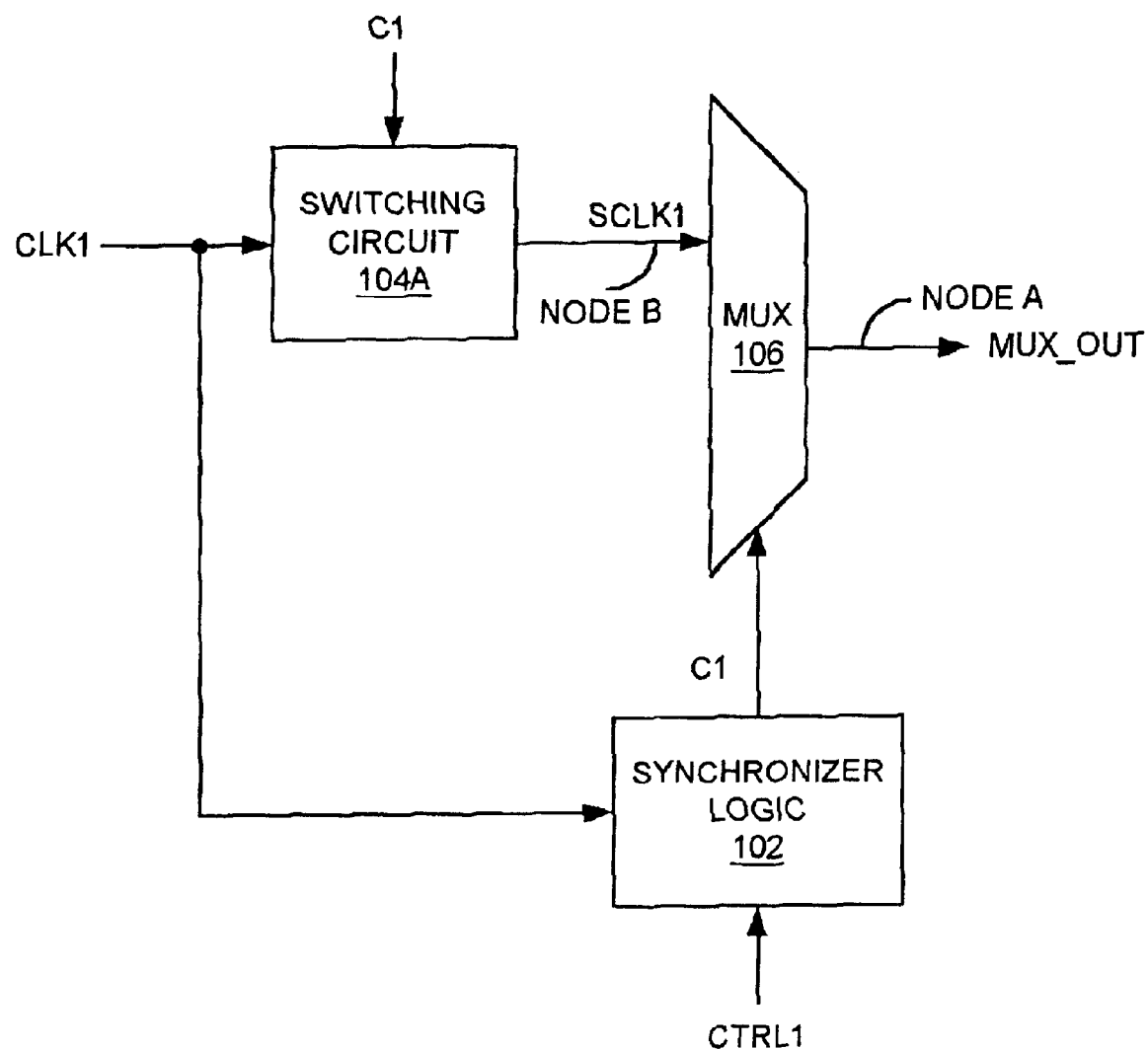
FIG. 8 is a diagram of a portion of the clock signal selector circuit of FIG. 3 including the synchronizer logic of FIGS. 3 and 4A, the multiplexer of FIGS. 3 and 5, and one of the multiple switching circuits of FIG. 3.

FIG. 8 is a diagram of a portion of the clock signal selector circuit 100 of FIG. 3 including the synchronizer logic 102 of FIGS. 3 and 4A, the MUX 106 of FIGS. 3 and 5, and the switching circuit 104A of FIG. 3.

The switching circuit 104A receives the clock signal CLK1 at an input terminal and the control signal C1 at a control terminal. An output terminal of the switching circuit 104A is connected to a corresponding input terminal of the MUX 106. The node B exists between the output terminal of the switching circuit 104A and the corresponding input terminal of the MUX 106. When the control signal C1 is asserted (i.e., active), the switching circuit 104A forms an electrical connection between the input terminal and the output terminal. In this situation, the switching circuit 104A produces the input clock signal CLK1 as the SCLK1 signal.

For reasons described below, the switching circuit 104A preferably does not drive the node B when the control signal C1 is deasserted (i.e., is not active). The switching circuit 104A may be, for example, a tri-state buffer. Tri-state buffers advantageously have a voltage gain greater than 1 when the input voltage is between VIH and VIL. The switching circuit 104A may also be, for example, a transmission gate. Although the clock signal selector circuit 100 of FIG. 3 may suffer increased power dissipation when multiple drivers drive node B at the same time, the switching circuit 104A may also be a storage element such as a latch or flip-flop.

Figure 9:
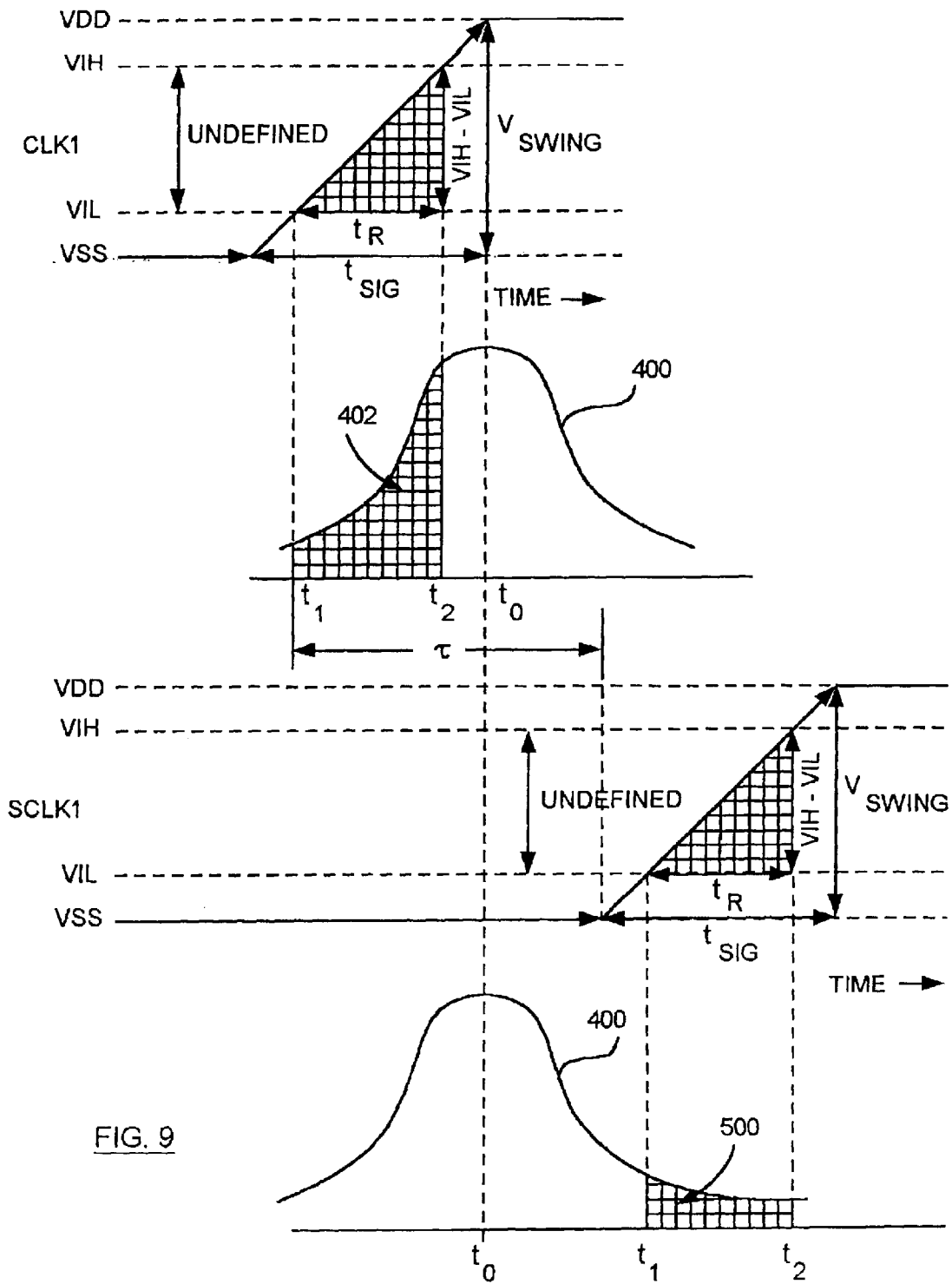
FIG. 9 is a diagram depicting estimations of probabilities of errors in a signal produced by the switching circuit of FIG. 8 and in the output signal produced by the multiplexer of FIG. 8 due to metastability.

FIG. 9 is a diagram depicting estimations of probabilities of errors in the signal SCLK1 produced by the switching circuit 104A of FIG. 8 and in the output signal MUX_OUT produced by the MUX 106 of FIG. 8 due to metastability. The control signal C1 is not shown in FIG. 9, but is transitioning from high to low as the clock signal CLK1 is transitioning from low to high as shown in FIG. 7. As in FIG. 7, the time at which a sampling event occurs within the MUX 106 of FIG. 8 as the control signal C1 transitions from high to low is modeled as having the Gaussian probability distribution 400 centered about the mean time $t_o$. As before, a linear approximation of the rising edge transition of the CLK1 signal is assumed when the sampling event occurs within the MUX 106 of FIG. 8.

In FIG. 9, the probability of error in the signal SCLK1 produced by the switching circuit 104A of FIG. 8 at node B due to metastability is indicated by the hatched region 402 of the Gaussian probability distribution 400 between times $t_1$ and $t_2$ associated with the rising edge transition of the clock signal CLK1. It is noted that the probability of error in the signal SCLK1 produced by the switching circuit 104A of FIG. 8 due to metastability in FIG. 9 is the same as the probability of error in the output signal MUX_OUT produced by the MUX 106 of FIG. 6 and shown in FIG. 7.

In FIG. 9, the rising edge transition of the clock signal SCLK1 follows the rising edge transition of the clock signal CLK1 by a propagation time "τ" of the switching circuit 104A of FIG. 8. The probability of error in the output signal MUX_OUT produced by the MUX 106 of FIG. 8 at node A due to metastability is indicated by the hatched region 500 of the Gaussian probability distribution 400 between times $t_1$ and $t_2$ associated with the rising edge transition of the clock signal SCLK1.

It is noted that the switching circuit 104A introduces delay, therefore the clock signal SCLK1 is delayed with respect to the clock signal CLK1. However, the control signal C1 is provided to the switching circuit 104A and to the MUX 106 simultaneously. Due to the resulting simultaneous operations, the probability of metastability at the output of the MUX 106 is significantly reduced.

As evident in FIG. 9, the probability of error in the output signal MUX_OUT produced by the circuit of FIG. 8 at node A due to metastability is significantly less than that of the circuit of FIG. 6. That is, the addition of the switching circuit 104A to the circuit of FIG. 6 significantly reduces the probability of error in the MUX_OUT signal produced by the MUX 106 at the node A. More specifically, the time delay "τ" introduced by the switching circuit 104A reduces the probability of error in the MUX_OUT signal produced by the MUX 106 at the node A by a factor proportional to $e^{(-\tau/a)}$.

Referring back to FIG. 3, the switching circuit 108A electrically connects node A to node B when the control signal C1 is a logic '0' (i.e., is low). Assuming an output driver of the MUX 106 driving node A is stronger than any output driver of the switching circuit 104A driving node B, when the switching circuit 108A electrically connects node A to node B, the probability of error due to metastability at node B becomes equal to the probability of error due to metastability at node A. FIG. 9 shows the probability of error at node A due to metastability being significantly less than the probability of error at node B due to metastability when the control signal C1 transitions from high to low (i.e., when the clock signal CLK1 is deselected). More specifically, the probability of error at node A due to metastability is less than that of node B by the factor $e^{(-\tau/a)}$ when the control signal C1 transitions from high to low (i.e., when the clock signal CLK1 is deselected). Accordingly, the feedback from node A to node B provided by the switching circuit 108A significantly reduces the probability of error in the MUX_OUT signal produced by the MUX 106 at the node A when the clock signal CLK1 is deselected.

Similarly, the switching circuit 108B of FIG. 3 electrically connects node A to node C when the control signal C2 is a logic '0' (i.e., is low). Assuming the output driver of the MUX 106 driving node A is stronger than any output driver of the switching circuit 104B driving node C, when the switching circuit 108B electrically connects node A to node C, the probability of error due to metastability at node C becomes equal to the probability of error due to metastability at node A. Via the same mechanism described above and depicted in FIG. 9, the feedback from node A to node C provided by the switching circuit 108B significantly reduces the probability of error in the MUX_OUT signal produced by the MUX 106 at the node A when the clock signal CLK2 is deselected.

Figure 10:
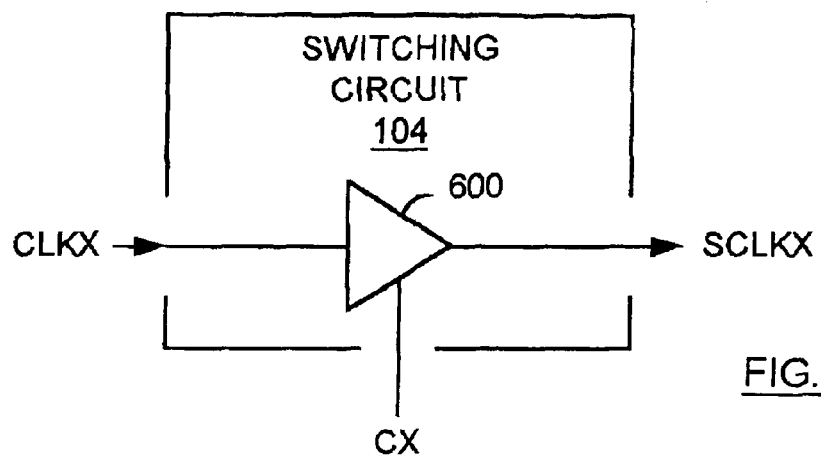
FIG. 10 is a diagram of one embodiment of a representative one of a first set of the switching circuits of FIG. 3 wherein the representative switching circuit includes a tri-state buffer.

FIG. 10 is a diagram of one embodiment of a representative one of the switching circuits 104 of FIG. 3 wherein the representative switching circuit 104 includes a tri-state buffer 600. The tri-state buffer 600 receives the clock signal CLKX at an input terminal and the control signal CX at a control terminal, where X=1 or 2. When the control signal CX is asserted (i.e., active), the tri-state buffer 600 produces the input clock signal CLKX as the output signal SCLKX at an output terminal. When the control signal CX is deasserted (i.e., not active), the tri-state buffer 600 does not drive the output terminal. The tri-state buffer 600 expectedly has a voltage gain greater than 1 when the input clock signal CLKX has a voltage between VIH and VIL.

Figure 11A:
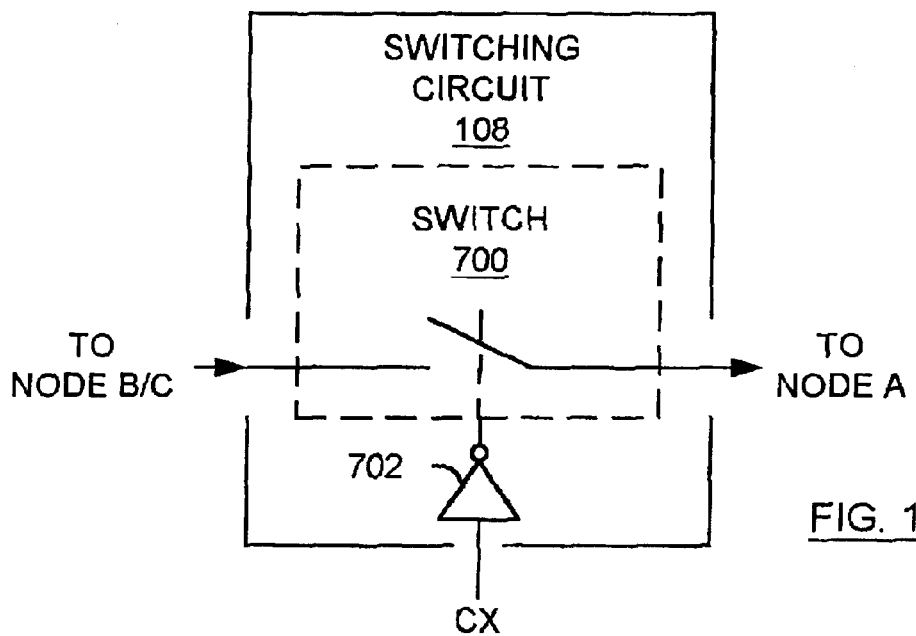
FIG. 11A is a diagram of one embodiment of a representative one of the second set of the switching circuits of FIG. 3.

FIG. 11A is a diagram of one embodiment of a representative one of the switching circuits 108 of FIG. 3. In the embodiment of FIG. 11A, the switching circuit 108 includes a switch 700 and an inverter 702. The inverter 702 receives the control signal CX at a control terminal, where X=1 or 2, and produces the logical inverse of the control signal CX at an output terminal. An input terminal of the switch 700 is connected to node A, and an output terminal of the switch 700 is connected to either node B (switching circuit 108A) or node C (switching circuit 108B). When the control signal CX is deasserted (i.e., not active), the switch 700 forms an electrical connection between the input terminal and the output terminal. In this situation, the switch 700 forms an electrical connection between the node A and the node B (switching circuit 108A) or the node A and the node C (switching circuit 108B).

Figure 11B:
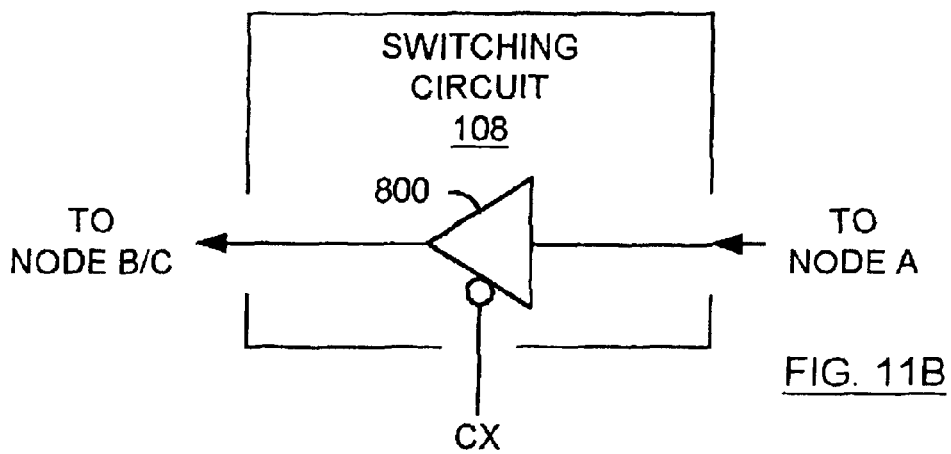
FIG. 11B is a diagram of another embodiment of the representative one of the second set of switching circuits of FIG. 3 wherein the representative switching circuit includes a tri-state buffer.

FIG. 11B is a diagram of another embodiment of the representative one of the switching circuits 108 of FIG. 3 wherein the representative switching circuit 108 includes a tri-state buffer 800. An input terminal of the tri-state buffer 800 is connected to the node A, and an output terminal of the tri-state buffer 800 is connected to either node B (switching circuit 108A) or node C (switching circuit 108B). The tri-state buffer 800 receives the control signal CX at a control terminal, where X=1 or 2. When the control signal CX is deasserted (i.e., not active), the tri-state buffer 800 drives the node B (switching circuit 108A) or the node C (switching circuit 108B) with the MUX_OUT signal at the node A. When the control signal CX is asserted (i.e., active), the tri-state buffer 800 does not drive the node B (switching circuit 108A) or the node C (switching circuit 108B). The tri-state buffer 800 expectedly has a voltage gain greater than 1 when the input MUX_OUT signal at the node A has a voltage between VIH and VIL.

Referring back to FIG. 3, the clock signal selector circuit 100 of FIG. 3 includes a first storage element 110A and a second storage element 110B in series between node A and the output terminal of the clock signal selector circuit 100. The storage element 110A receives the signal MUX_OUT produced by the MUX 106 at an input terminal, and the storage element 110B produces the output signal CLK_OUT of the clock signal selector circuit 100 at an output terminal. Both the storage elements 110A and 110B receive either the clock signal CLK1 or the clock signal CLK2 at control terminals.

In one embodiment, the storage elements 110A and 110B are edge-triggered flip-flops. The storage element 110A is configured to store a value of the input signal MUX_OUT when the clock signal CLK1 (or CLK2) transitions from high to low, and to produce the stored value as the output signal at the output terminal. The storage element 110B is configured to store a value of the input signal from the storage element 110A when the clock signal CLK1 (or CLK2) transitions from low to high, and to produce the stored value as the output signal CLK_OUT at the output terminal.

It is noted that in other embodiments the storage elements 110A and 110B may be other types of flip-flops. For example, the storage elements 110A and 110B may be edge triggered or level sensitive flip-flops or latches.

The time delay introduced by the cascaded storage elements 110A and 110B significantly reduces the probability of error in the output signal CLK_OUT due to metastability.

It is noted that where the delay introduced by the switching circuit 104A and the MUX 106 is smaller than the delay introduced by the storage elements 110A and 110B, the total latency of the clock signal selector circuit 100 of FIG. 3 is determined by the delay time introduced by the storage elements 110A and 110B. (The storage elements 110A and 110B typically have delays that are either half a cycle or a full cycle each.) In this situation, the reduction in probability of error in the output signal CLK_OUT due to metastability brought about by using the switching circuits 104A, 104B, 108A, and 108B is achieved without increasing the latency of the clock signal selector circuit 100, and is advantageous in high-speed circuits.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A clock signal selector circuit, comprising:
   a synchronizer circuit coupled to receive a first clock signal and a first control signal corresponding to the first clock signal, and configured to synchronize the first control signal to the first clock signal thereby producing a second control signal;
   a first switching circuit coupled to receive the first clock signal and the second control signal, comprising an output terminal coupled to a first node, and configured to produce a first clock signal at the output terminal in the event the second control signal is asserted;
   a multiplexer coupled between the first node and a second node and to receive the second control signal, and configured to drive the second node with a signal at the first node in the event the second control signal is asserted; and
   a second switching circuit coupled between the first and second nodes and to receive the second control signal, and configured to form an electrical connection between the first and second nodes in the event the second control signal is deasserted.

2. The clock signal selector circuit as recited in claim 1, wherein the first switching circuit significantly reduces a probability of error at the second node due to metastability in the event the second control signal transitions from asserted to deasserted and the first clock signal is deselected.

3. The clock signal selector circuit as recited in claim 2, wherein in providing electrical feedback from the second node to the first node in the event the second control signal transitions from asserted to deasserted and the first clock signal is deselected, the second switching circuit further reduces the probability of error at the second node due to metastability.

4. The clock signal selector circuit as recited in claim 1, wherein the synchronizer circuit is coupled to receive a second clock signal and a third control signal corresponding to the second clock signal, and is configured to synchronize the third control signal to the second clock signal thereby producing a fourth control signal.

5. The clock signal selector circuit as recited in claim 4, wherein the multiplexer is coupled to a third node and to receive the fourth control signal, and configured to drive the second node with a signal at the third node in the event the fourth control signal is asserted.

6. The clock signal selector circuit as recited in claim 5, further comprising:
   a third switching circuit coupled to receive the second clock signal and the fourth control signal, comprising an output terminal coupled to the third node, and configured to produce the second clock signal at the output terminal in the event the fourth control signal is asserted.

7. The clock signal selector circuit as recited in claim 6, further comprising:
   a fourth switching circuit coupled between the second and third nodes and to receive the fourth control signal, and configured to form an electrical connection between the second and third nodes in the event the fourth control signal is deasserted.

8. The clock signal selector circuit as recited in claim 1, wherein the first switching circuit comprises a transmission gate or a tri-state buffer.

9. The clock signal selector circuit as recited in claim 1, wherein the first switching circuit comprises a first terminal coupled to receive the first clock signal, a second terminal coupled to the first node, and a control terminal coupled to receive the second control signal, and wherein the first switching circuit is configured to form an electrical connection between the first and second terminals in the event the second control signal is asserted.

10. The clock signal selector circuit as recited in claim 1, wherein the first switching circuit comprises a first terminal coupled to receive the first clock signal, a second terminal coupled to the first node, and a control terminal coupled to receive the second control signal, and wherein the first switching circuit is configured to drive the second terminal with the first clock signal in the event the second control signal is asserted.

11. The clock signal selector circuit as recited in claim 1, wherein the second switching circuit comprises a transmission gate or a tri-state buffer.

12. The clock signal selector circuit as recited in claim 1, wherein the second switching circuit comprises a first terminal coupled to the first node, a second terminal coupled to the second node, and a control terminal coupled to receive the second control signal, and wherein the second switching circuit is configured to form an electrical connection between the first and second terminals in the event the second control signal is deasserted.

13. The clock signal selector circuit as recited in claim 1, wherein the second switching circuit comprises a first terminal coupled to the first node, a second terminal coupled to the second node, and a control terminal coupled to receive the second control signal, and wherein the second switching circuit is configured to drive the first terminal with a signal at the second terminal in the event the second control signal is deasserted.

14. The clock signal selector circuit as recited in claim 1, further comprising:
 a pair of storage elements connected in series between the second node and an output terminal of the clock signal selector circuit.

15. The clock signal selector circuit as recited in claim 14, wherein each of the pair of storage elements comprises a flip-flop.

16. A clock signal selector circuit, comprising:
 a synchronizer circuit coupled to receive first and second clock signals and first and second control signals and configured to synchronize the first control signal to the first clock signal thereby producing a third control signal, and to synchronize the second control signal to the second clock signal thereby producing a fourth control signal;
 a first switching circuit coupled to receive the first clock signal and the third control signal, comprising an output terminal coupled to a first node, and configured to produce a first clock signal at the output terminal in the event the third control signal is asserted;
 a second switching circuit coupled to receive the second clock signal and the fourth control signal, comprising an output terminal coupled to a second node, and configured to produce a second clock signal at the output terminal in the event the fourth control signal is asserted;
 a multiplexer coupled to the first and second nodes and to receive the third and fourth control signals, and comprising an output terminal coupled to a third node, and configured to drive the output terminal with a signal at the first node in the event the third control signal is asserted, and to drive the output terminal with a signal at the second node in the event the fourth control signal is asserted;
 a third switching circuit coupled between the first and third nodes and to receive the third control signal, and configured to form an electrical connection between the first and third nodes in the event the third control signal is deasserted; and
 a fourth switching circuit coupled between the second and third nodes and to receive the fourth control signal, and configured to form an electrical connection between the second and third nodes in the event the fourth control signal is deasserted.

17. The clock signal selector circuit as recited in claim 16, wherein the first and second switching circuits significantly reduce a probability of error at the third node due to metastability in the event the respective third and fourth control signals transition from asserted to deasserted and the respective first and second clock signals are deselected.

18. The clock signal selector circuit as recited in claim 17, wherein the third and fourth switching circuits further reduce the probability of error at the third node due to metastability by providing electrical feedback from the third node to the respective first and second nodes in the event the respective third and fourth control signals transition from asserted to deasserted and the respective first and second clock signals are deselected.

19. The clock signal selector circuit as recited in claim 16, wherein the first and second switching circuits comprise transmission gates or tri-state buffers, and wherein the third and fourth switching circuits comprise transmission gates or tri-state buffers.

20. The clock signal selector circuit as recited in claim 16, further comprising:
 a pair of flip-flops connected in series between the third node and an output terminal of the clock signal selector circuit.

* * * * *